United States Patent
Ihle et al.

(10) Patent No.: US 12,177,986 B2
(45) Date of Patent: Dec. 24, 2024

(54) COMPONENT AND METHOD FOR MANUFACTURING A COMPONENT

(71) Applicant: TDK Electronics AG, Munich (DE)

(72) Inventors: Jan Ihle, Raaba-Grambach (AT); Thomas Bernert, Deutschlandsberg (AT); Stefan Endler, Graz (AT); Michael Krenn, Dobl-Zwaring (AT); Stephan Bigl, Graz (AT); Markus Puff, Graz (AT); Sebastian Redolfi, Graz (AT)

(73) Assignee: TDK Electronics AG, Munich (DE)

( * ) Notice: Subject to any disclaimer, the term of this patent is extended or adjusted under 35 U.S.C. 154(b) by 321 days.

(21) Appl. No.: 17/637,725

(22) PCT Filed: Oct. 12, 2020

(86) PCT No.: PCT/EP2020/078583
§ 371 (c)(1),
(2) Date: Feb. 23, 2022

(87) PCT Pub. No.: WO2021/074068
PCT Pub. Date: Apr. 22, 2021

(65) Prior Publication Data
US 2022/0287187 A1 Sep. 8, 2022

(30) Foreign Application Priority Data
Oct. 16, 2019 (DE) .......................... 102019127924.0

(51) Int. Cl.
*H05K 3/30* (2006.01)
*H01C 7/02* (2006.01)
(Continued)

(52) U.S. Cl.
CPC ............. *H05K 3/303* (2013.01); *H01C 7/025* (2013.01); *H01G 2/06* (2013.01); *H05K 1/181* (2013.01); *H05K 3/341* (2013.01)

(58) Field of Classification Search
CPC ........ H05K 3/303; H05K 1/181; H05K 3/341; H01C 7/025; H01G 2/06
(Continued)

(56) References Cited

U.S. PATENT DOCUMENTS

| 5,628,919 A * | 5/1997 | Tomura | H05K 3/4007 |
| | | | 156/89.18 |
| 7,547,407 B2 * | 6/2009 | Matsuda | C04B 41/52 |
| | | | 264/619 |

(Continued)

FOREIGN PATENT DOCUMENTS

| CN | 1630946 A | 6/2005 |
| CN | 110993332 A | 4/2020 |

(Continued)

OTHER PUBLICATIONS

Ruffing, K., "Semiconductor chips embedded directly in the substrate," All-Electronics, https://www.all-electronics.de/markt/halbleiterchips-direkt-im-substrat-eingebettet.html (Stand: Feb. 19, 2013, 16:39), Feb. 19, 2013, 17 pages.

*Primary Examiner* — Binh B Tran
(74) *Attorney, Agent, or Firm* — Slater Matsil, LLP (57) ABSTRACT

In an embodiment a component includes at least one carrier layer, the carrier layer having a top side and a bottom side and at least one functional layer arranged on the top side of the carrier layer, the functional layer including a material having a specific electrical characteristic, wherein the component is configured for direct integration into an electrical system as a discrete component.

14 Claims, 10 Drawing Sheets

(51) Int. Cl.
*H01G 2/06* (2006.01)
*H05K 1/18* (2006.01)
*H05K 3/34* (2006.01)

(58) Field of Classification Search
USPC ........................................................ 361/760
See application file for complete search history.

(56) References Cited

U.S. PATENT DOCUMENTS

| | | |
|---|---|---|
| 7,586,755 B2 | 9/2009 | Satoh et al. |
| 7,746,213 B2 * | 6/2010 | Zitzmann ................. G01K 7/16 |
| | | 338/25 |
| 8,436,426 B2 * | 5/2013 | Le Neel ................. H01L 28/20 |
| | | 257/379 |
| 8,610,281 B1 | 12/2013 | Nguyen et al. |
| 9,029,180 B2 | 5/2015 | Britton et al. |
| 9,496,202 B2 | 11/2016 | Hashimoto |
| 9,945,734 B1 | 4/2018 | Arft et al. |
| 10,790,263 B2 | 9/2020 | Lee |
| 10,908,030 B2 | 2/2021 | Ihle et al. |
| 2010/0096666 A1 | 4/2010 | Ishida et al. |
| 2011/0134961 A1 | 6/2011 | Bernitz et al. |
| 2014/0376595 A1 | 12/2014 | Daley et al. |
| 2015/0042445 A1 | 2/2015 | Fujita et al. |
| 2015/0055682 A1 * | 2/2015 | Nagatomo ............. G01K 1/143 |
| | | 374/185 |
| 2015/0276504 A1 | 10/2015 | Yanata et al. |
| 2016/0259139 A1 * | 9/2016 | Kraft ..................... H01L 23/481 |
| 2017/0084859 A1 * | 3/2017 | Schwamb ............ H10K 50/805 |
| 2018/0306647 A1 | 10/2018 | Ihle et al. |
| 2018/0321088 A1 | 11/2018 | Martinez et al. |
| 2018/0337134 A1 * | 11/2018 | Mitsukura ........... H01L 23/5389 |

FOREIGN PATENT DOCUMENTS

| | | |
|---|---|---|
| DE | 10358282 A1 | 7/2005 |
| DE | 102006033856 B3 | 2/2008 |
| DE | 102009026439 A1 | 12/2010 |
| DE | 102016101247 A1 | 5/2017 |
| JP | H06124810 A | 5/1994 |
| JP | H09148178 A | 6/1997 |
| JP | 2000013016 A | 1/2000 |
| JP | 2007019149 A | 1/2007 |
| JP | 2009076608 A | 4/2009 |
| JP | 2012156274 A | 8/2012 |
| JP | 2013197367 A | 9/2013 |
| JP | 2013538462 A | 10/2013 |
| JP | 2015034760 A | 2/2015 |
| JP | 2017535054 A | 11/2017 |
| JP | 2018169248 A | 11/2018 |
| JP | 2019158815 A | 9/2019 |
| WO | 2006109369 A1 | 10/2006 |
| WO | 2015015953 A1 | 2/2015 |

* cited by examiner

COMPONENT AND METHOD FOR MANUFACTURING A COMPONENT

This patent application is a national phase filing under section 371 of PCT/EP2020/078583, filed Oct. 12, 2020, which claims the priority of German patent application 102019127924.0, filed Oct. 16, 2019, each of which is incorporated herein by reference in its entirety.

TECHNICAL FIELD

The present invention relates to a component, in particular to an electrical component. The present invention further relates to a method for manufacturing a component.

BACKGROUND

In order to integrate passive components, for example sensors, capacitors, protection components and/or heaters, into electrical systems, the dimensions of the components have to be adapted for modern packaging designs, which are in the micrometer and even nanometer scale range. To achieve this level of miniaturization, the devices are deposited as thin films on carrier structures with electrical connections and described as discrete devices. These components can be integrated into MEMS (Micro Electro Mechanical System) or SESUB (Semiconductor Embedded in Substrate) structures.

However, current technical solutions are not suitable for the integration of electronic components in MEMS or SESUB structures, for example. For these systems, very small elements are required, which must also be integrable with suitable contacting methods. Classical soldering methods for SMD ("Surface Mounted Device") designs or wire bonding technologies for "bare dies" cannot be used for this purpose.

SUMMARY

Embodiments provide a component which solves the above problems.

According to one embodiment, a component is described. The component is an electrical component. The component is configured for integration into an electrical system.

The component is preferably a passive component. The component is, for example, a sensor, capacitor, protective component or heating element.

The component has at least one carrier layer. The carrier layer has a top side and a bottom side. The carrier layer comprises a carrier material. Preferably, the carrier layer comprises silicon, silicon carbide or glass (silicate or borosilicate glass).

The component further comprises at least one functional layer. The component may also have more than one functional layer, for example two or three functional layers. The functional layer comprises a material (functional material) which has a special electrical characteristic. For example, the functional material has a specific U/I characteristic, a specific R-value and B-value characteristic, a specific charge/discharge curve, a specific capacitance, and/or a specific $R_{IS}(T)$.

The functional layer is preferably arranged on the top side of the carrier layer. Preferably, the functional layer completely covers the top side of the carrier layer. Preferably, the functional layer is formed directly on the top side of the carrier layer. In particular, the functional material is located on the material of the carrier layer in a form-fitting and material-fitting manner. Alternatively, the functional material is generated directly in the material of the carrier layer locally or as a layer.

Alternatively—depending on the design of the carrier layer, for example in the case of a silicon carrier—a thin electrically insulating film can also be formed between the carrier layer and the functional layer.

Due to the special composition, the component can be made very compact. For example, the component has a width of preferably less than or equal to 500 µm, for example 100 µm or 250 µm. The component 1 further has a length of preferably less than or equal to 500 µm, for example 100 µm or 250 µm. The component preferably has a height or thickness of less than or equal to 100 µm, for example 50 µm.

Consequently, the component is designed to be very compact so that it can be integrated as a complete component in an electrical system, such as a printed circuit board or a silicon chip. In particular, the component is designed to be embedded directly in an electrical system as a discrete component. For example, the component is designed for direct integration into a MEMS structure and/or into a SESUB structure.

Preferably, the functional layer is a thin film layer. In other words, the functional layer has only a very small thickness. For example, the functional layer has a thickness d of 10 nm≤d≤1 µm, for example 500 nm. In this way, a very small, discrete component is provided that can be easily embedded in existing structures.

In one embodiment, the functional layer comprises a dielectric or antiferroelectric ceramic based on an oxide material in the perovskite structure type. The perovskite can have solid solutions of the composition PLZT (lead (Pb)-lanthanum (La)-zirconium (Zr)-titanium (T)). La can be completely or partially replaced by, for example, Na, or Cu.

Alternatively, the functional layer may comprise an ion-conducting ceramic based on a material in the Nasicon structure type. The composition can be based on solid solutions of LATP (Lithium Aluminium Titanium Phosphate), LVP (Lithium Vanadium Phosphate), LZP (Lithium Zirconium Phosphate) and other typical active materials for batteries such as LiCo or LiFeP.

Alternatively, the functional layer may comprise a semiconducting material based on an oxide of spinel structure type or perovskite structure type. The composition
  of the spinel may be based on solid solutions of $NiMn_2O_4$, where Ni and Mn may be fully or partially replaced with, for example, Fe, Co, or Al. The perovskite can be based on
  solid solutions of $CaMnO_3$, where Ca may be wholly or partially replaced with, for example, Y, Cr, Al, or La.

Alternatively, the functional layer may comprise a semiconducting material based on a perovskite structure of polycrystalline $BaTiO_3$. Pb, Sr or Ca may be used to adjust the Curie temperature. The material can have Y, Mn, Fe as dopants. The polycrystalline structure preferably exhibits a positive temperature coefficient.

In an alternative embodiment, the functional layer has a semiconducting material based on silicon carbide in the hexagonal wurtzite-like structure or the cubic phase in the zinc-trim structure type. Alternatively, the functional layer may have a metal nitride in the wurtzite structure type.

These materials described above enable the deposition of the functional layer on the carrier layer as a stable thin film layer. Thus, a reliable and compact component can be provided.

In one embodiment, the component has a protective layer. The protective layer is arranged on a top side of the component. Preferably, the protective layer completely covers the top side of the component.

For example, the protective layer is formed on a top side of the functional layer. However, the protective layer may also be formed on structures arranged on the functional layer. The protective layer protects the component from external influences. Preferably, the protective layer comprises $SiO_2$.

In a further embodiment, at least one side face, preferably all side faces, of the component can also be covered by a protective layer. This protective layer also preferably comprises $SiO_2$. In particular, this protective layer preferably consists of $SiO_2$.

In one embodiment, the component has at least one feedthrough. The component may also have more than one feedthrough, for example two or four feedthroughs. The feedthrough comprises a metallic material. The feedthrough penetrates the carrier layer completely. In other words, the feedthrough extends from the functional layer at the top side of the carrier layer to the bottom side of the carrier layer. The bottom side of the carrier layer is the side of the carrier layer or of the component that rests on the electronic system into which the component is integrated or on a component of the electronic system.

In an alternative embodiment, the feedthrough may additionally completely penetrate the functional layer. In this case, the feedthrough extends from a top side of the functional layer through the functional layer and the carrier layer to the bottom side of the carrier layer.

Furthermore, at least one contact element for electrical contacting of the component is formed on the bottom side of the carrier layer. However, the component may also have more than one contact element, for example two or four contact elements. The contact element is directly connected to the feedthrough on the bottom side of the carrier layer.

The contact element may, for example, have a bump or a thin electrode. The feedthrough and contact element provide the electrical contact and connection surfaces by means of which the component can be electrically contacted. Conventional soldering processes for SMDs or wire bonding for electrical contacting can therefore be omitted. This makes the component ideally suited for integration into a MEMS or SESUB structure.

In one embodiment, the component also has at least one cover electrode. The cover electrode comprises for example Au, Ni, Cr, Ag, W, Ti or Pt. The cover electrode is designed for electrical contacting of the functional layer from a top side of the functional layer. Thus, the component can be contacted in a reliable manner from the bottom side via the feedthrough and the contact element and from the top side via the cover electrode.

Preferably, the cover electrode is arranged directly on the functional layer. In particular, the cover electrode is deposited on the top side of the functional layer. The cover electrode can be sputtered onto the functional layer. The cover electrode has a thin metal film. Preferably, the cover electrode is a thin-film electrode. The cover electrode can have a single-layer or multilayer design. For example, the cover electrode has a thickness d of 10 nm≤d≤1 µm, for example 500 nm. In this way, a very compact component is provided for direct integration into an electrical system.

In one embodiment, the component has at least two cover electrodes. Preferably, the cover electrodes are arranged next to each other. The respective cover electrode covers only part of the top side of the functional layer.

The cover electrodes are spatially and electrically separated from each other by at least one recess or at least one gap. The resistance of the component can be varied or adjusted by the size (in particular the width) of the recess and thus the size of the distance between the cover electrodes.

Instead of a recess, a comb-like interlocking structure can also be provided between the two cover electrodes. In this way, the area between the cover electrodes is increased. Further, the comb-like structure reduces the resistance of the component and also reduces a variation of the resistance.

According to one embodiment, a method for manufacturing a component, in particular an electrical component, is described. Preferably, the method produces the component described above. All features disclosed with respect to the component or the method are also disclosed correspondingly with respect to the respective other embodiment, and vice versa, even if the respective feature is not explicitly mentioned in the context of the respective embodiment. The method comprises the following steps:

A) Providing a carrier material for forming the carrier layer (wafer). The carrier material preferably comprises Si, SiC or glass. The carrier layer formed by the carrier material serves to stabilize the component.

B) Formation of at least one feedthrough. The feedthrough preferably penetrates the carrier material completely. In other words, a breakthrough is created through the carrier material, which is later filled with a metallic material.

In this process step, it can be provided that the breakthrough only completely penetrates the carrier material after a thinning step of the carrier material. In other words, first an opening/recess can be made in the carrier material and then carrier material is removed so that the opening/recess completely penetrates the carrier material. Alternatively, the carrier material can also be provided with a penetrating opening in a single process step.

C) Filling the at least one feedthrough with a metallic material, for example by electroplating. The metallic material may for example comprise copper or gold.

D) Coating the carrier material with a functional material to form the functional layer. The resulting functional layer is preferably a thin-film layer.

The coating is carried out, for example, by means of a PVD ("physical vapor deposition") process, a CVD ("chemical vapor deposition") process or electroplating. Optionally, this can be followed by an annealing step.

Alternatively, the functional layer can be generated by a sol-gel process or by means of ceramic slurry and applied to the carrier material by a CSD (chemical solution deposition) process, for example spin coating. In this case, a subsequent thermal process is required.

Depending on the ceramic, the thermal process involves a rapid heating ramp in the range of a few K/s to K/min and up to a maximum of 1200° C. with a holding time of up to a maximum of 4 hours under air or inert gas such as argon, nitrogen, forming gas with or without humidity.

E) Singulation of the components. This can be done, for example, by applying photoresist followed by plasma etching or sawing and scoring of the functional layer and carrier layer.

The method produces a reliable and compact discrete component that can be easily integrated into existing electrical systems.

In one embodiment, at least one cover electrode is deposited on a top side of the functional material prior to step E). For example, the cover electrode can be created in one process step with the filling of the at least one feedthrough.

Alternatively, separate process steps can be provided for filling the feedthrough and for generating the cover electrode.

The generation of the at least one cover electrode is an optional step, i.e. the resulting component can also be formed without a cover electrode and can only be contacted from the bottom side via the feedthroughs and contact elements.

The deposition of the cover electrode is preferably done by means of a PVD process, a CVD process or galvanically. The resulting cover electrode is preferably a thin film electrode.

In one embodiment, step D) is performed before step B) or before step C). In other words, the coating of the carrier material with the functional material may be carried out before the formation of the at least one feedthrough or before the filling of the at least one feedthrough. In this case, the feedthrough protrudes into the functional layer. For example, the feedthrough is enclosed by the functional layer. Preferably, the feedthrough penetrates the carrier layer and the functional layer completely.

By applying the functional material before filling the at least one feedthrough, subsequent removal of the functional material can preferably be avoided. This enables a particularly cost-effective and fast manufacturing process.

BRIEF DESCRIPTION OF THE DRAWINGS

The drawings described below are not to be understood as true to scale. Rather, individual dimensions may be enlarged, reduced or even distorted for better representation.

Elements that are similar to one another or that perform the same function are designated with the same reference signs.

DETAILED DESCRIPTION OF ILLUSTRATIVE EMBODIMENTS

Figure 1:
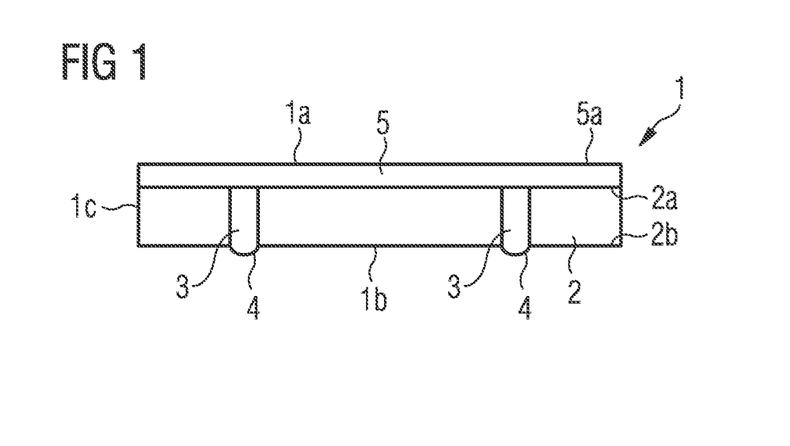
FIG. 1 shows a component according to a first embodiment.

FIG. 1 shows a component 1 according to a first embodiment. The component 1 is preferably designed as a passive component. The component 1 is preferably a sensor element, a capacitor, a protective component or a heating element.

The component 1 has at least one carrier layer 2 or a wafer 2. The carrier layer 2 has a top side 2a and a bottom side 2b. The carrier layer 2 has a carrier material, preferably silicon (Si), silicon carbide (SiC) or glass (silicate or borosilicate). The carrier layer 2 serves to mechanically stabilize the component 1.

The component 1 further comprises at least one functional layer 5. In this embodiment example, the component 1 has exactly one functional layer 5. However, several functional layers 5 are also conceivable, for example two, three or four functional layers 5, which can, for example, be arranged next to each other or one above the other.

In this embodiment example, the functional layer 5 is arranged on the top side 2a of the carrier layer 2. The functional layer 5 preferably completely covers the top side 2a of the carrier layer 2. The functional layer 5 is arranged on the carrier layer 2 in a form-fit and material-fit manner. Alternatively, the functional layer 5 is generated directly in a material of the carrier layer 2 locally or as a layer. The functional layer 5 has a very small thickness of less than or equal to 1 μm.

The functional layer 5 has a material with a specific electrical characteristic. For example, the functional layer 5 has a dielectric or antiferroelectric ceramic based on an oxide material in the perovskite structure type. The perovskite consists, for example, of solid solutions of the composition PLZT, in which La may be wholly or partially replaced by, for example, Na or Cu.

The functional layer 5 may also have an ion-conducting ceramic based on a material in the Nasicon structure type. In this case, the composition is based, for example, on solid solutions of LATP, LVP, LZP and other typical active materials for batteries such as LiCo, LiFeP.

Alternatively, the functional layer 5 may have a semiconducting material based on an oxide in the spinel structure type or perovskite structure type. The composition of the spinel is preferably based on solid solutions of $NiMn_2O_4$, in which Ni and Mn can be completely or partially replaced with, for example, Fe, Co, Al. The perovskite preferably has solid solutions of the composition $CaMnO_3$, in which Ca may be wholly or partially replaced by, for example, Y, Cr, Al or La.

The functional layer 5 can also have a semiconducting material based on a perovskite structure of polycrystalline $BaTiO_3$ with Pb, Sr, Ca to adjust the Curie temperature and, for example, Y, Mn, Fe as dopants. Here, the polycrystalline structure preferably has a positive temperature coefficient.

Alternatively, the functional layer 5 may also have a semi-conductive material based on silicon carbide in the hexagonal wurtzite-like structure or the cubic phase in the zinc-trim structure type. In an alternative embodiment, the functional layer 5 may further comprise a metal nitride in the wurtzite structure type.

In the embodiment according to FIG. 1, the carrier layer 2 further comprises two feedthroughs 3. Alternatively, the component 1 may have only one feedthrough 3 (see FIG. 3) or no feedthrough 3 at all (see FIG. 4). Furthermore, more than two feedthroughs 3, for example three or four feedthroughs, are also conceivable (not explicitly shown).

The respective feedthrough 3 penetrates the carrier layer 2 completely. In other words, the feedthrough 3 extends from the top side 2a to the bottom side 2b of the carrier layer 2. The feedthrough 3 has a metallic material, for example copper or gold.

The component 1 shown in FIG. 1 further comprises two contact elements 4. The contact elements 4 are arranged on the bottom side 2a of the carrier layer 2. The contact elements 4 are formed directly or immediately at the feedthroughs 3. The contact elements 4 are in electrical and mechanical contact with the feedthroughs 3. The contact elements 4 serve to electrically connect the component 1. Furthermore, the component 1 can be stacked on other components of an electrical system, for example, via the contact elements 4.

The contact elements 4 can, for example, be designed as bumps or as a thin electrode. The contact elements 4 have a metal, for example copper, gold or solderable alloys. The feedthroughs 3 serve to connect the functional layer 5 on the top side 2a of the carrier layer 2 with the contact elements 4 on the bottom side 2a of the carrier layer 2 and thus to contact the functional layer 5 electrically. Thus, a robust and reliable component 1 is provided.

In a further embodiment (not explicitly shown), a protective layer 7 is further arranged on a top side 1a of the component 1. In this case, the protective layer 7 is formed directly on the functional layer 5. The protective layer 7 completely covers a top side 5a of the functional layer 5. The protective layer 7 preferably has $SiO_2$. The protective layer 7 serves to protect the functional layer 5 and the component 1 from external influences (see also FIG. 2).

Due to its special contacting (feedthroughs 3, contact elements 4) and the special layer structure (thin functional layer 5 with special electrical characteristics), the component 1 is designed in such a way that it can be integrated as a complete component in a Si chip or on a printed circuit board. In particular, the component 1 is designed to be integrated as a discrete component in MEMS or SESUB structures.

Overall, the component 1 is designed to be very compact. The component 1 has a very small dimension. The component 1 has a width of preferably less than or equal to 500 μm, for example 50 μm, 100 μm, 250 μm, 300 μm, 400 μm or 450 μm. Preferably, the component 1 has a length of less than or equal to 500 μm, for example 50 μm, 100 μm, 250 μm, 300 μm, 400 μm or 450 μm. Preferably, the component 1 has a rectangular basic shape. The component 1 has a height (extension in stacking direction) of preferably less than or equal to 100 μm, for example 10 μm, 50 μm or 80 μm.

Due to the compact design and the contacting by means of the feedthroughs 3 and the contact elements 4, the component 1 is ideally suited for integration in MEMS or SESUB structures.

Figure 2:
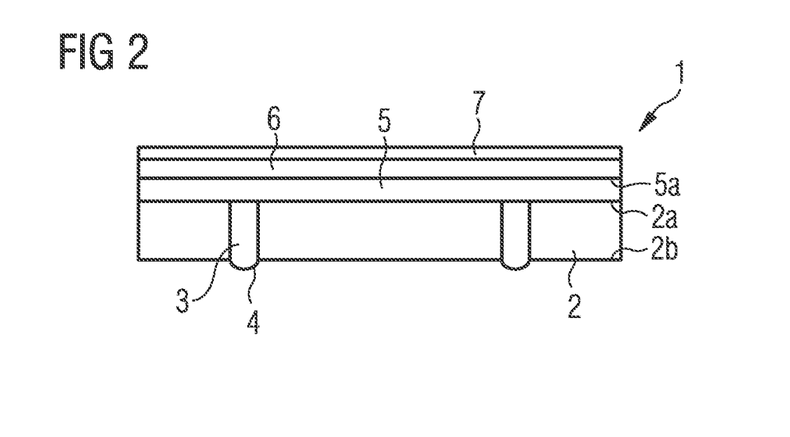
FIG. 2 shows a component according to a second embodiment.

FIG. 2 shows a component 1 in a second embodiment. In contrast to the component 1 described in connection with FIG. 1, the component 1 according to FIG. 2 additionally has a cover electrode 6. The cover electrode 6 is arranged on the top side 5a of the functional layer 5. In particular, the cover electrode 6 is applied directly to the functional layer 5. In this embodiment example, the cover electrode 6 completely covers the top side 5a of the functional layer 5. The functional layer 5 can be contacted from the top side by means of the cover electrode 6. Contact is made on the bottom side via the feedthroughs 3 and contact elements 4.

The cover electrode 6 has a metallic material, preferably Au, Ni, Cr, Ag, W, Ti or Pt. Preferably, the cover electrode 6 is deposited on the functional layer 5, for example by means of a PVD or CVD process or galvanically. Preferably, the cover electrode 6 is sputtered onto the functional layer 5. The cover electrode 6 is a thin film electrode. In other words, the cover electrode 6 preferably has a thin metal film. The cover electrode 6 has a thickness d or height of ≥100 nm and ≤1 μm, for example 500 nm.

In this embodiment, the component 1 further has the protective layer 7 already described in connection with FIG. 1. The cover electrode 6 is therefore arranged between the functional layer 5 and the protective layer 7 in the case shown. In other words, the protective layer 7 is formed directly on the cover electrode 6 in this embodiment.

In an alternative embodiment example (not explicitly shown), however, the protective layer 7 can also be omitted. In this case, the cover electrode 6 forms the top side of the component 1. In this embodiment example, it is possible to realize an additional contacting, for example by wire bonding on the cover electrode 6 (not explicitly shown).

With regard to all further features of the component 1 according to FIG. 2, reference is made to the description of FIG. 1.

Figure 3:
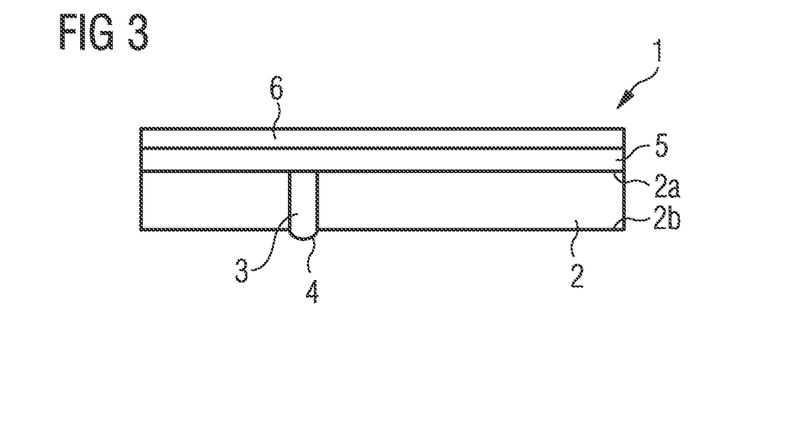
FIG. 3 shows a component according to a third embodiment.

FIG. 3 shows a component 1 in a third embodiment. In this embodiment, the component 1 has only one feedthrough 3 and one contact element 4, whereby the functional layer 5 is contacted from the bottom side. The contact element 4 can be designed as a bump or as a thin electrode, as already described.

In this embodiment, the component 1 further has the cover electrode 6 already described in connection with FIG. 2. In contrast to FIG. 2, the cover electrode 6 in this embodiment is mandatory for (top) contacting of the functional layer 5.

With regard to all further features of the component 1 according to FIG. 3, reference is made to the description of FIG. 1 and FIG. 2.

Figure 4:
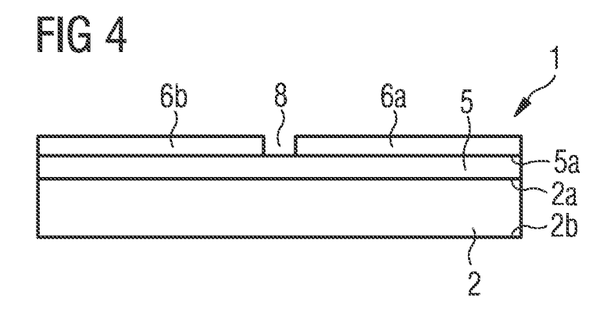
FIG. 4 shows a component according to a fourth embodiment.

FIG. 4 shows a component 1 in a fourth embodiment. In this embodiment, the component 1 has no feedthroughs 3 and also no contact elements 4 on the bottom side 2a of the carrier layer 2. Rather, the functional layer 5 is contacted here exclusively from the top side. In particular, the component 1 has two cover electrodes 6a, 6b for electrical connection of the component 1. The cover electrodes 6a, 6b are formed directly on the functional layer 5, preferably deposited, as already explained in connection with FIG. 2. The cover electrodes 6a, 6b are arranged next to each other on the functional layer 5.

The respective cover electrode 6a, 6b can be formed in a single layer or in multiple layers. The respective cover electrode 6a, 6b is preferably a thin film electrode. The respective cover electrode 6a, 6b preferably has at least one sputtered metal layer. For example, the respective cover electrode 6a, 6b has Au, Ni, Cr, Ag, W, Ti or Pt. Preferably, the respective cover electrode 6a, 6b has a thickness or height between wo nm and 1 μm.

In this embodiment, the cover electrodes 6a, 6b form the top side of the component 1. Alternatively (not explicitly shown), however, a protective layer 7 can also be provided, which is arranged on the cover electrodes 6a, 6b.

The cover electrodes 6a, 6b are electrically separated from each other. For this purpose, at least one recess or gap 8 is formed between the cover electrodes 6a, 6b, as shown in FIG. 4. This recess 8 separates the cover electrodes 6a, 6b spatially and electrically. With the size (horizontal extension, i.e. extension perpendicular to the stacking direction) of the recess 8, the resistance of the component 1 can be adjusted. If the size of the recess 8 is reduced, the resistance decreases. However, this also increases a scattering of the resistance. To avoid this or to increase the area between the cover electrodes 6a, 6b and thus reduce the resistance, a comb structure can also be provided between the cover electrodes 6 (not shown explicitly). In this case, the cover electrodes 6 are arranged side by side in an interlocking manner.

Figure 5:
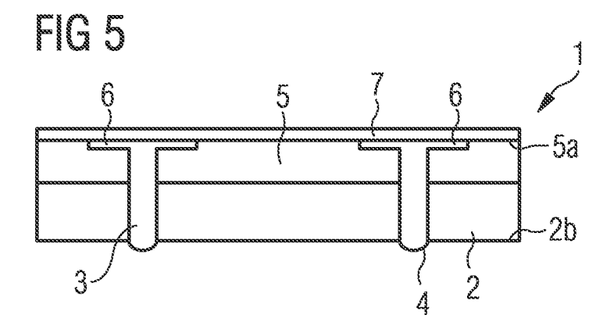
FIG. 5 shows a component according to a fifth embodiment.

FIG. 5 shows a component 1 in a fifth embodiment. In this embodiment, the component 1 has two feedthroughs 3, two contact elements 4, and two cover electrodes 6.

Compared to the embodiment shown in FIG. 1, in this embodiment the feedthroughs 3 penetrate not only the carrier layer 2 but also the functional layer 5 completely. In particular, the respective metallic feedthrough 3 projects into the functional layer 5 and is enclosed by it. The respective feedthrough thus extends from the bottom side 2b of the carrier layer 2 through the carrier layer 2 and the functional layer 5 to the top side 5a of the functional layer 5.

A cover electrode 6 is formed on the top side of the respective feedthrough 3 in each case. In this embodiment example, the respective cover electrode 6 is also at least partially embedded in the functional layer 5. The cover electrodes 6 thus at least partially form the top side 5a of the functional layer 5.

The protective layer 7 is formed directly on the functional layer 5. In this case, the protective layer 7 covers the top side 5a of the functional layer 5, which is at least partially formed by the cover electrodes 6.

Contact is made on the bottom side via feedthroughs 3 and contact elements 4, for example bumps. More than the feedthroughs shown in FIG. 5 can be provided, for example four feedthroughs.

Figure 6:
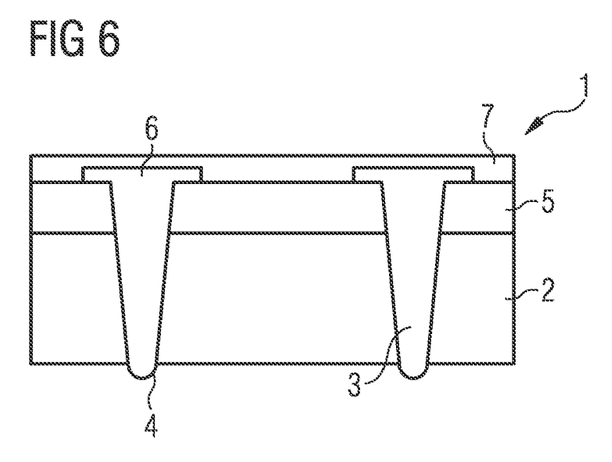
FIG. 6 shows a component according to a sixth embodiment.
Figure 7:
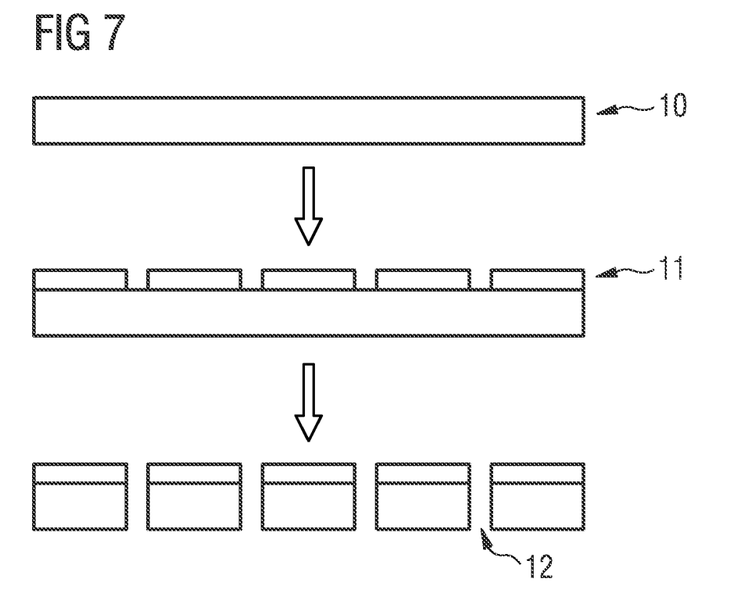
FIGS. 7-11 show a method for manufacturing a component.

FIG. 6 shows a component 1 in a sixth embodiment. As in the embodiment shown in FIG. 5, the component 1 has two feedthroughs 3, two contact elements 4 and two cover electrodes 6.

Here, too, the feedthroughs 3 penetrate the functional layer 5 completely. In particular, each feedthrough extends from the bottom side of the carrier layer 2 through the carrier layer 2 and the functional layer 5 to the top side of the functional layer 5.

In contrast to the embodiment according to FIG. 5, the respective feedthrough 3 is conical here. In this case, the respective cover electrode 6 is produced in an electroplating process. Subsequently, a "fly-cutting" step can be carried out for planarization.

In this embodiment, the respective cover electrode 6 is formed on the surface of the functional layer 5.

The protective layer 7 is formed directly on the functional layer 5. The protective layer 7 covers the top side of the functional layer 5. The contacting on the bottom side is again made via the feedthroughs 3 and contact elements 4, for example bumps.

FIGS. 7 to 11 show a method for manufacturing a component 1. Preferably, the method manufactures the component 1 according to one of the embodiments described above. All features described in connection with the component 1 are therefore also applicable to the method and vice versa.

In a first step A), a carrier material 10 is provided for forming the carrier layer 2 described above (see FIG. 7 top). Preferably, the carrier material 10 comprises Si, SiC or glass.

In a next step B), the feedthroughs 3 described above are produced. For this purpose, vias/breakthroughs 12 are created in the carrier material 10, for example by photolithography and subsequent plasma etching ("dry etching") (see FIG. 7 centre and bottom). Alternatively, the vias 12 can also be produced with a laser (laser drilling).

Figure 8:
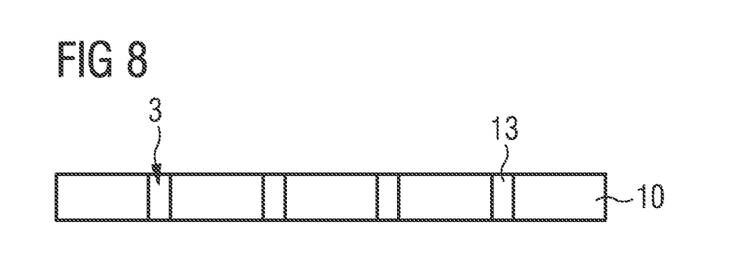

In a step C), the vias/breakthroughs 12 are filled with a metallic material 13 (e.g. copper), e.g. by electroplating (see FIG. 8). The photoresist 11 used in photolithography (see FIG. 7) is then washed off.

Figure 9:
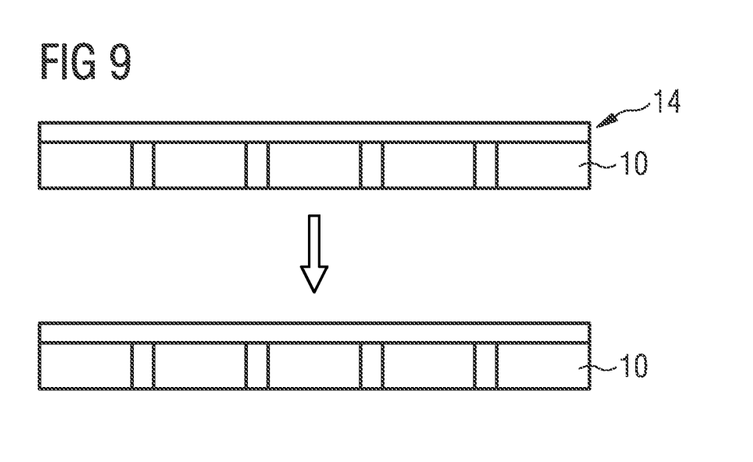

In a further step D), the carrier material 10 is coated with a functional material 14 to form the functional layer 5 (see FIG. 9).

The coating is carried out, for example, by a PVD or CVD process. Thereby, a thin film of the functional material 14 is produced on the carrier material 10. Optionally, an annealing step can take place after step D).

Alternatively, the functional layer 5 can also be produced by a sol-gel process or by means of ceramic slurry and applied to the carrier material 10 by a CSD process (e.g. spin coating). In this variant, a subsequent thermal process is required.

In an alternative embodiment, the process step D) can also be carried out before the generation of the vias/breakthroughs 12 (step B)). In this case, the metallic material 13 projects into the functional layer 5 and is enclosed by it (see also the embodiment described in connection with FIG. 5/FIG. 6).

Figure 10:
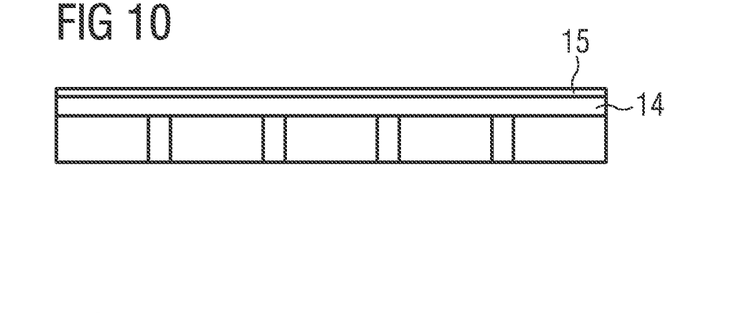

In a further step, electrode material 15 is deposited to form the at least one cover electrode 6 (see FIG. 10 in connection with FIGS. 2 to 6). The electrode material 15 preferably comprises Au, Ni, Cr, Ag, W, Ti or Pt. The deposition is carried out by a PVD or CVD process or galvanically.

A single-layer or multilayer thin cover electrode 6 (thin film electrode) is produced. In particular, the cover electrode 6 is deposited as a thin electrode film on the functional material 14 in this process step. If two cover electrodes 6 are deposited, a recess (see FIG. 4) or a comb-like structure is provided for electrical separation of the cover electrodes 6a, 6b.

In an optional step, the formation of the protective layer 7 can further be carried out by applying the appropriate material (preferably $SiO_2$) either to the functional material 14 (embodiment according to FIG. 1) or to the electrode material 15 (embodiments according to FIGS. 2 to 6).

Figure 11:
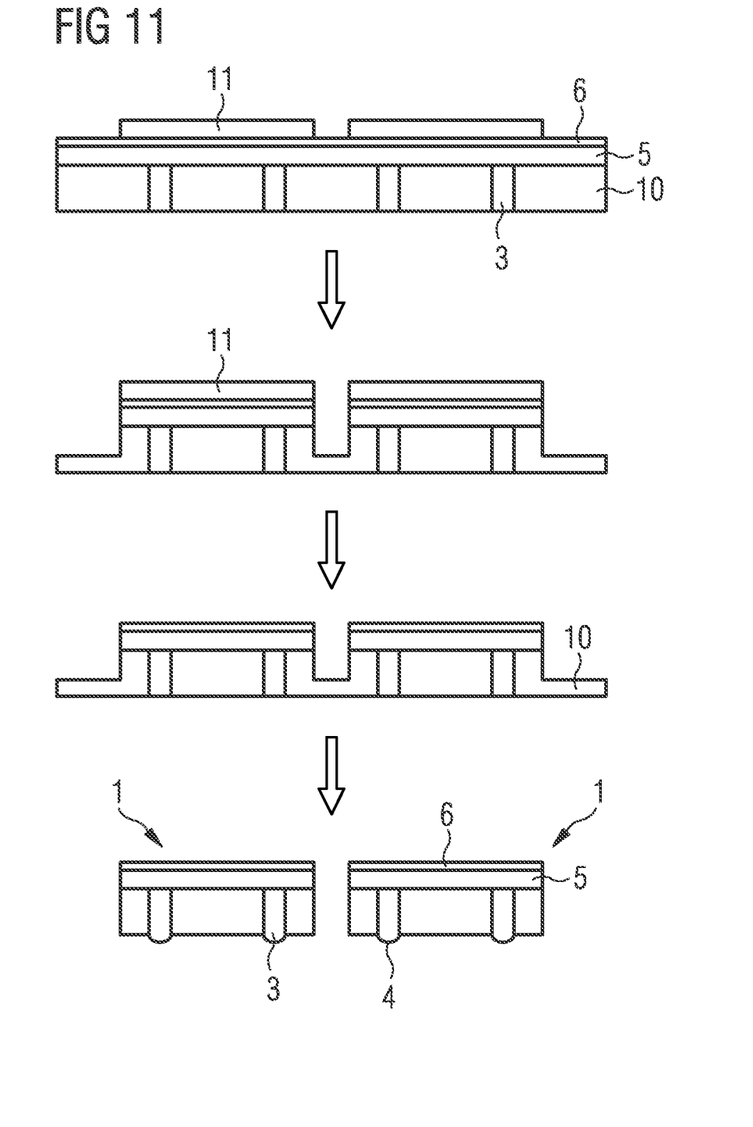
Figure 12:
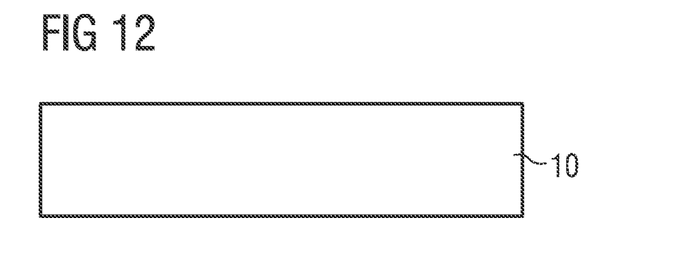
FIGS. 12-17 show an alternative method for manufacturing a component.
Figure 13:
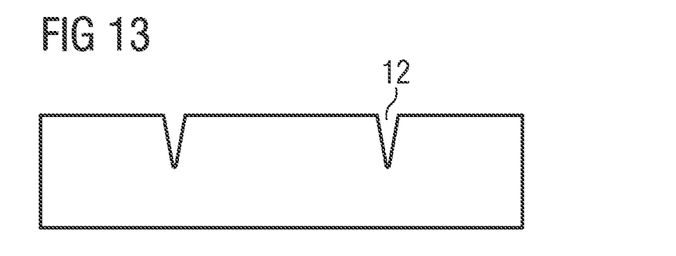

In a final step E), the components 1 are singulated (see FIG. 11). This is done by applying photoresist 11 and subsequent plasma etching or sawing of the functional layer 5 and the part of the carrier material 10 which determines the height or thickness of the later carrier layer 2 (notching).

Alternatively, the thinning of the carrier material 10 on the bottom side can be carried out in two steps, whereby in a first step the carrier material 10 is etched or ground away over its surface, and in a second step the separation is carried out by etching over its surface and the contact elements 4 are exposed without oxidizing the metal in the process.

FIGS. 12 to 17 show an alternative method for producing a component 1. Preferably, in the following method a component 1 with a glass carrier layer 2 is produced.

In a first step, a carrier material 10 is provided for forming the carrier layer 2 described above (see FIG. 12). Preferably, the carrier material 10 comprises borosilicate glass (glass wafer).

In a further step (see FIG. 13), the feedthroughs 3 are produced. In this embodiment, this is done by etching vias/breakthrough 12 in the glass wafer, preferably by LIDE (laser induced deep etching). In this process, breakthroughs 12 are preferably created which have a conical shape (see also FIG. 6).

Figure 14:
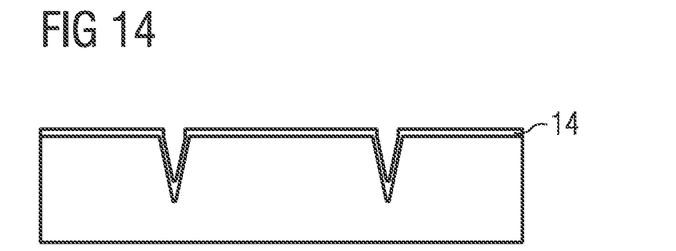
Figure 15:
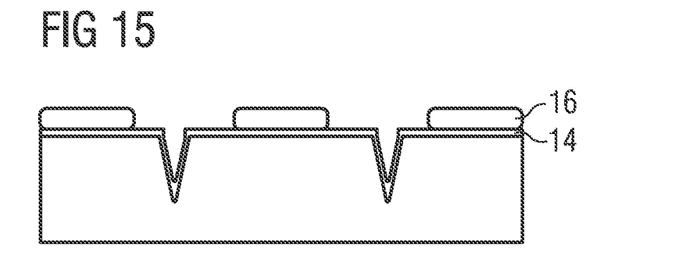

In a further step, the carrier material 10 is coated with a functional material 14 to form the functional layer 5, for example an NTC layer (FIG. 14). Here, functional material 14 can also be applied in an inner region of the respective via/breakthrough 12. In particular, the inner region of the via/breakthrough 12 is completely coated with the functional material 14.

In this embodiment, the functional material 14 remains completely on the carrier material 10 or in the inner region of the via/breakthrough 12. Subsequent steps for partial removal of the functional material 14, which are both expensive and time-consuming, are not required. This simplifies and cheapens the process.

In a further step, the vias/breakthroughs 12 are filled with a metallic material 13 (preferably copper), preferably galvanically. For this purpose, a sacrificial layer or seed layer of the metallic material 13 (preferably copper) is first sputtered onto the functional material 14 (not explicitly shown). Furthermore, a photolithography mask 16 (photoresist) is applied to the functional material 14 (FIG. 11).

Subsequently, the vias/breakthroughs 12 are galvanically filled with the metallic material 13. Metallic material 13 is also deposited at least partially in spaces between the photolithography mask 16 on the top side of the functional material 14 to form the cover electrodes 6 (FIG. 16).

Figure 16:
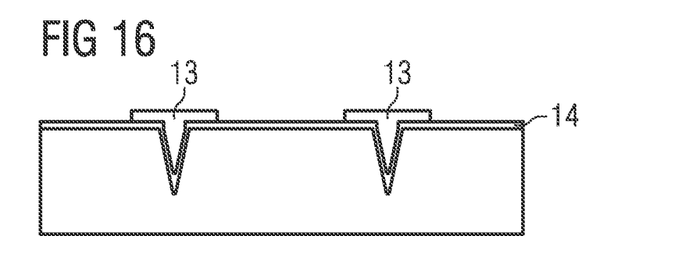

The photolithography mask 16 is then removed again, e.g. washed off (FIG. 16). Furthermore, the previously mentioned sacrificial layer or seed layer is also partially removed, for example by etching.

Figure 17:
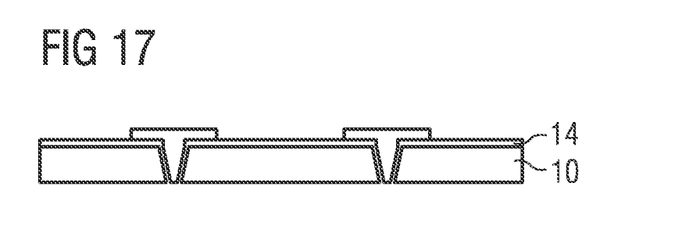

In a final step, the carrier material 10 is thinned out on the bottom side by backgrinding or etching (FIG. 17). The metallic material 13 then protrudes from the bottom side of the carrier material 10 to the top side of the functional material 14. The metallic material 13 thus completely penetrates the two layers. The metallic material 13 partially rests on the top side of the carrier material 14, as can be seen in FIGS. 16 and 17 (see also FIG. 6).

FIGS. 18 to 22 show an alternative method for producing a component 1. Preferably, in the following method, a component 1 with a glass carrier layer 2 is produced.

Figure 18:
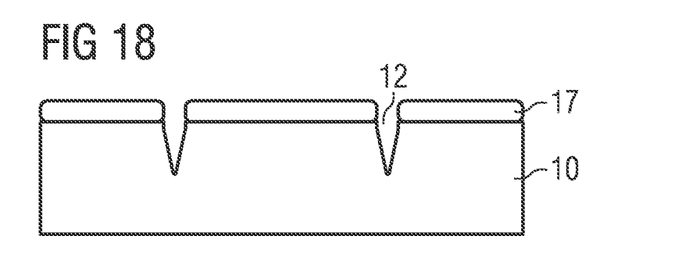
FIGS. 18-22 show an alternative method for manufacturing a component.

In a first step, a carrier material 10 is provided for forming the carrier layer 2 described above. Preferably, the carrier material 10 comprises glass (silicate or borosilicate) (glass wafer).

In contrast to the method described in connection with FIGS. 12 to 17, a hard mask 17 is applied to the top side of the carrier layer 10 in a next step (FIG. 18). The mask 17 is preferably a solid support with structures, for example recesses.

In a next step, the feedthroughs 3 are created. This is done by etching vias/breakthroughs 12 in the glass wafer. Breakthroughs 12 are created which have a conical shape (FIG. 18).

Figure 19:
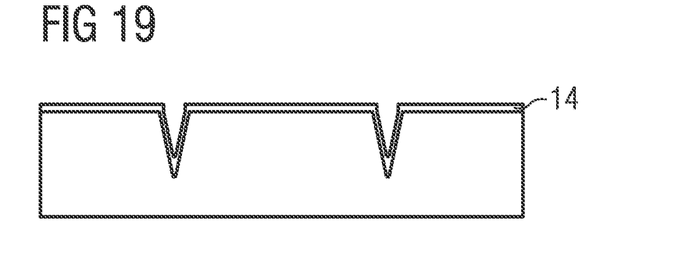

In a further step, the mask 17 is removed. The carrier material 10 is then coated with a functional material 14 to form the functional layer 5, for example an NTC layer (FIG. 19). Functional material 14 is also applied in an inner region of the respective breakthrough 12. Here, too, a subsequent partial removal of the functional material 14 is not necessary, which simplifies the process and makes it more cost-effective.

Figure 20:
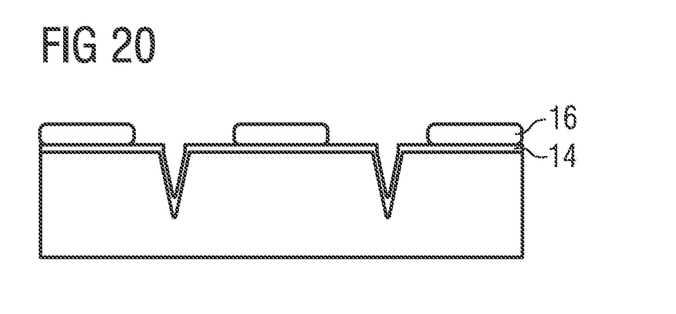

In a further step, the vias/breakthroughs 12 are filled with a metallic material 13 (for example copper). For this purpose, a sacrificial layer/seed layer of the metallic material 13 is first sputtered on ("seed layer sputtering"). Furthermore, a photolithography mask 16 is applied to the functional material 14 (FIG. 20).

In the following, the vias/breakthroughs 12 are galvanically filled with the metallic material 13. Metallic material 13 is also partially applied to the top side of the functional material 14 in the spaces between the photolithography mask 16.

Figure 21:
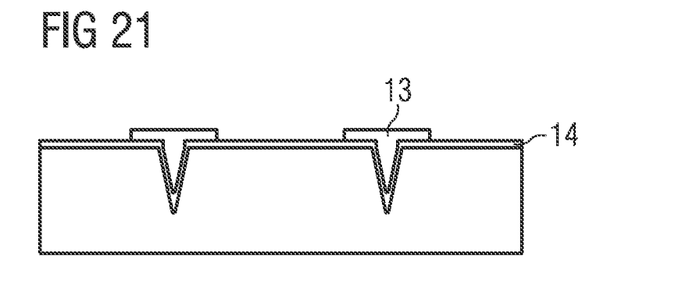

The photolithography mask 16 is subsequently removed. Furthermore, the sacrificial layer or seed layer is also partially removed again, for example by etching (FIG. 21).

Figure 22:
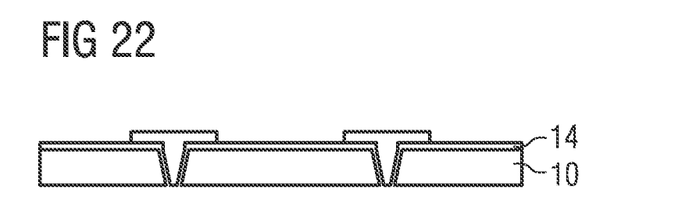
Figure 23:
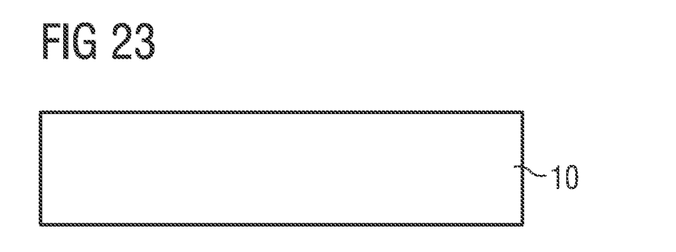
FIGS. 23-28 show an alternative method for manufacturing a component.

In a final step, the carrier material 10 is again thinned out on the bottom side by backgrinding or etching (FIG. 22).

FIGS. 23 to 28 show an alternative method for producing a component 1. Preferably, in the following method a component 1 with a silicon carrier layer 2 is produced.

In a first step, a carrier material 10 is provided for forming the carrier layer 2 described above (FIG. 23). Preferably, the carrier material 10 comprises silicon (silicon wafer).

Figure 24:
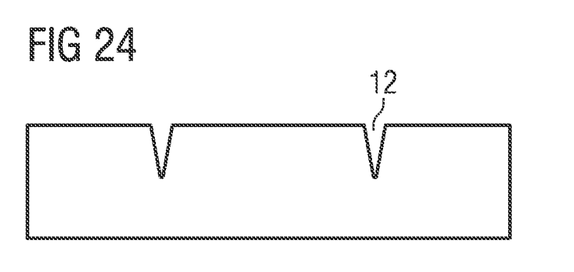

In a next step, the feedthroughs 3 are produced. In particular, vias/breakthroughs 12 are made in the silicon wafer with the aid of a laser (FIG. 24). The breakthroughs 12 preferably have a conical shape.

In a further step, an electrically insulating layer is created by applying a corresponding material (preferably $SiO_2$) to the carrier material 10 (not explicitly shown). In particular, the carrier material 10 is coated with the electrically insulating material. Thereby, a thin film of the electrically insulating material is formed.

Figure 25:
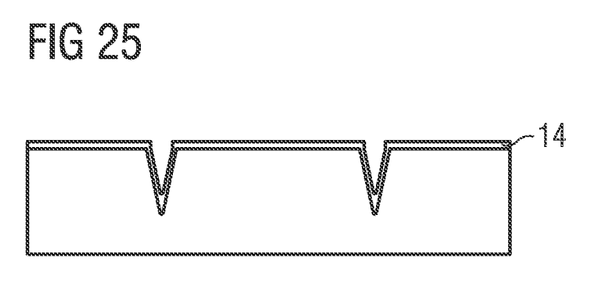

In a next step, the carrier material 10 is coated with a functional material 14 to form the functional layer 5 (FIG. 25). The functional material 14 is thereby applied to the insulating layer. The functional material 14 is also applied in an inner region of the vias/breakthroughs 12.

Figure 26:
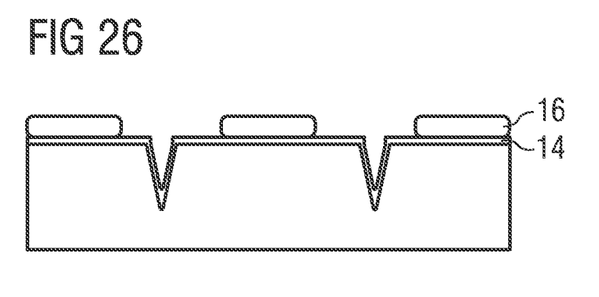

In a further step, the vias/breakthroughs 12 are filled with a metallic material 13 (preferably copper). For this purpose, again a sacrificial layer of the metallic material 13 is first sputtered on. Furthermore, a photolithography mask 16 (photoresist) is applied to the functional material 14 (FIG. 26).

Figure 27:
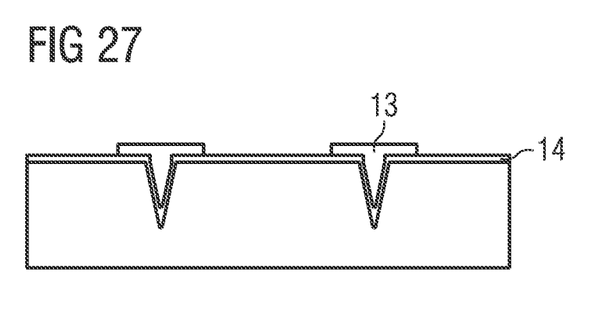

Subsequently, the vias/breakthroughs 12 are galvanically filled with the metallic material 13. The photolithography mask 16 and in parts also the sacrificial layer are then removed, for example by means of washing or etching (FIG. 27).

Figure 28:
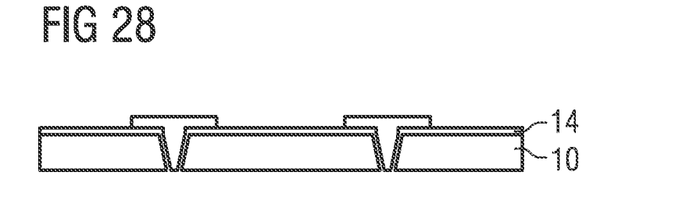

In a final step, the carrier material 10 is thinned out on the bottom side by backgrinding or etching (FIG. 28). In this method, too, an at least partial removal of functional material 14 is not necessary, resulting in a simplified and cost-effective process.

FIGS. 29 to 35 show an alternative method for producing a component 1. Preferably, in the following method a component 1 with a silicon carrier layer 2 is produced.

In a first step, a carrier material 10 is provided for forming the carrier layer 2 described above (FIG. 29). Preferably, the carrier material 10 comprises silicon (silicon wafer).

Figure 29:
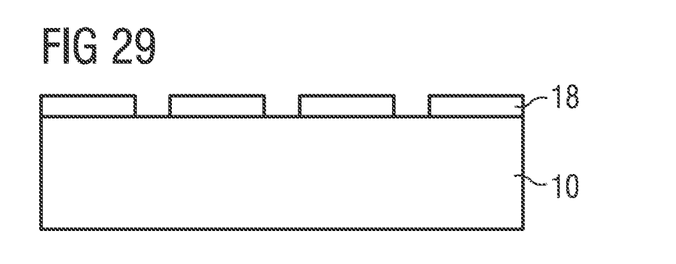
FIGS. 29-35 show an alternative method for manufacturing a component.
Figure 30:
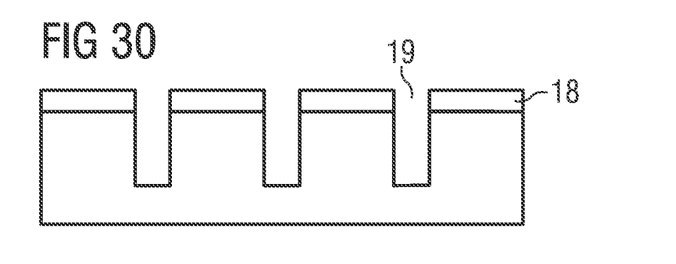

Subsequently, recesses 19 are created in the carrier material 10. For this purpose, photoresist 18 is applied to a top side of the carrier material 10 (FIG. 29). Subsequently, the recesses 19 are created in areas between the photoresist 18 by plasma etching (FIG. 30). In a next step, the photoresist 18 is removed again.

In a further step, an electrically insulating layer is created by applying an appropriate material (preferably $SiO_2$) to the carrier material 10 (not explicitly shown). In particular, the carrier material 10 is coated with the electrically insulating material. A thin film of the electrically insulating material is formed.

Figure 31:
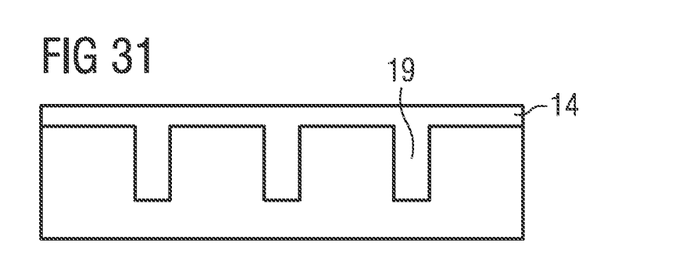

In a next step, the carrier material 10 is coated with a functional material 14 to form the functional layer 5 (FIG. 31). For example, a thin NTC layer is applied to the carrier material 10 or to the insulating layer. Carrier material 14 is also applied into the previously created recesses 19. In particular, the recesses 19 are filled with the carrier material 14.

Figure 32:
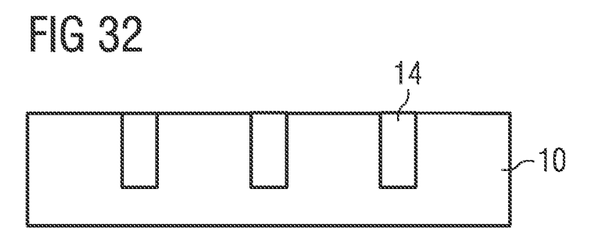

Subsequently, the functional material 14 is abraded on a top side of the carrier material 10. In particular, the abrading is performed in such a way that the functional material 14 preferably remains only in the previously created recesses 19, but not on the surface of the carrier material 10 (FIG. 32). In particular, the functional material 14 preferably closes flatly with the surface of the carrier material 10.

Figure 33:
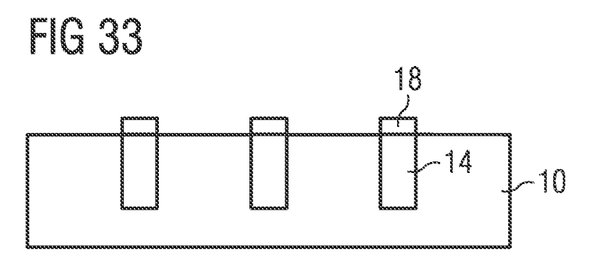
Figure 34:
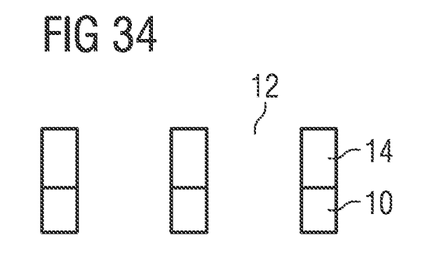

In a next step, a top side of the functional material 14 is coated with photoresist 18 (FIG. 33). Subsequent plasma etching removes a large area of the carrier material 10. In particular, the carrier material 10 remains only underneath the previously created functional material 14. In this way, vias/breakthroughs 12 are created between individual sections/columns of carrier material 10 and functional material 14 (see FIG. 34). The photoresist 18 is then removed.

Figure 35:
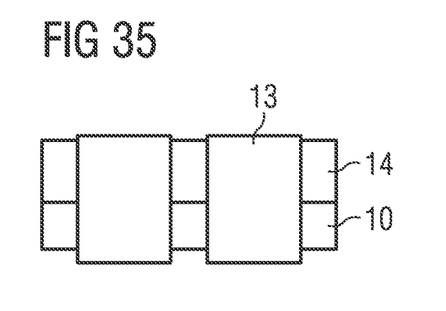

In a further step, the vias/breakthroughs 12—after application of a sacrificial layer/seed layer (not explicitly shown)—are galvanically filled with a metallic material 13 (preferably copper) (FIG. 35). In this method, final thinning of the carrier layer 2 is not necessary, since the carrier material 10 has already been removed in a previous step by plasma etching.

The description of the objects disclosed herein is not limited to the individual specific embodiments. Rather, the features of the individual embodiments can be combined with one another in any desired manner, insofar as this makes technical sense.

The invention claimed is:

1. A component comprising:
    at least one carrier layer having a top side and a bottom side;
    at least one functional layer arranged on the top side of the carrier layer, the functional layer comprising a material having a specific electrical characteristic;
    at least two cover electrodes configured for electrically contacting the functional layer from a top side of the functional layer,
    wherein the cover electrodes are arranged next to one another and are spatially and electrically separated from one another by at least one recess or a comb-like structure, and
    wherein the cover electrodes are arranged directly on the functional layer;
    at least one feedthrough completely penetrating the carrier layer and the functional layer such that the feedthrough extends from the top side of the functional layer through the functional layer and the carrier layer to the bottom side of the carrier layer; and
    at least one contact element arranged on the bottom side of the carrier layer, the at least one contact element configured for electrically contacting of the component,
    wherein the component is configured for direct integration into an electrical system as a discrete component.

2. The component according to claim 1, wherein the carrier layer comprises silicon, silicon carbide or glass.

3. The component according to claim 1, wherein the functional layer is arranged on the carrier layer in a form-fitting and material-fitting manner, or wherein the functional layer is located directly in a material of the carrier layer locally or as a layer.

4. The component according to claim 1, further comprising at least one protective layer arranged on a top side of the component and/or on at least one side face of the component.

5. The component according to claim 4, wherein the protective layer comprises $SiO_2$.

6. The component according to claim 1, wherein the component has at least two feedthroughs, wherein two contact elements are located on the bottom side of the carrier layer.

7. The component according to claim 1, wherein the cover electrodes comprise at least one sputtered layer.

8. The component according to claim 1, wherein the component is configured for direct integration into a Micro Electro Mechanical System (MEMS) structure and/or into a Semiconductor Embedded in Substrate (SESUB) structure.

9. A method for manufacturing the component according to claim 1, the method comprising:
    providing a carrier material for forming the carrier layer;
    forming the at least one feedthrough, the feedthrough completely penetrating the carrier material;
    filling the at least one feedthrough with a metallic material;
    coating the carrier material with a functional material to form the functional layer;
    singulating components; and
    before singulating the components, depositing the two cover electrodes on the top side of the functional material for electrically contacting the functional layer from the top side of the functional layer.

10. The method according to claim 9, wherein the functional layer is generated by a physical vapor deposition (PVD) or chemical vapor deposition (CVD) process, or wherein the functional material is provided by a sol-gel process or by a ceramic slurry and is applied to the carrier material by a chemical solution deposition (CSD) process.

11. The method according to claim 9, further comprising annealing after coating the carrier material with the functional material.

12. The method according to claim 9, wherein coating the carrier material with the functional material is performed before forming the at least one feedthrough or before filling the at least one feedthrough.

13. The method according to claim 9, further comprising forming the at least one contact element for electrically contacting the component on the bottom side of the carrier layer.

14. The method according to claim 9, wherein the component is formed for direct integration into a Micro Electro Mechanical System (MEMS) structure and/or into a Semiconductor Embedded in Substrate (SESUB) structure.

* * * * *